United States Patent [19]
Tada et al.

[11] Patent Number: 4,799,009
[45] Date of Patent: Jan. 17, 1989

[54] SEMICONDUCTOR TESTING DEVICE

[75] Inventors: Tetsuo Tada; Keisuke Okada, both of Hyogo, Japan

[73] Assignee: VLSI Technology Research Association, Kanagawa, Japan

[21] Appl. No.: 479,117

[22] Filed: Mar. 31, 1983

Related U.S. Application Data

[63] Continuation of Ser. No. 200,354, Oct. 24, 1980, abandoned.

[30] Foreign Application Priority Data

Oct. 25, 1979 [JP] Japan .................. 54-139156

[51] Int. Cl.$^4$ .................. G01R 1/06; G01R 31/02
[52] U.S. Cl. .................. 324/158 P; 324/72.5; 324/158 F
[58] Field of Search .............. 324/158 F, 158 P, 72.5

[56] References Cited

U.S. PATENT DOCUMENTS 3,702,439  11/1972  McGahey et al. .............. 324/158 P
3,849,728  11/1974  Evans .............................. 324/158 F Primary Examiner—Ernest F. Karlsen
Attorney, Agent, or Firm—Sughrue, Mion, Zinn, Macpeak & Seas

[57] ABSTRACT

A wafer testing device in which a plurality of wafers can be tested simultaneously significantly reducing the time required for testing each chip. A prober is provided which receives a wafer to be tested. A probe card is coupled to the prober having a window through which a plurality of semiconductor memory chips on the wafer are observable. A plurality of probes are coupled to the periphery of the window in such a manner that the probes can be brought into contact with bonding pads on the plurality of semiconductor memory chips. A tester is connected to the probes which is capable of simultaneously testing each of the plurality of chips.

2 Claims, 5 Drawing Sheets

SEMICONDUCTOR TESTING DEVICE

This application is a continuation of application Ser. No. 200,354, filed 10/24/80, now abandoned.

BACKGROUND OF THE INVENTION

The present invention relates to a semiconductor testing device in which the arrangement of bonding pads on a chip is modified, and in correspondence to this modification, the construction of a probe card and the arrangement of chips on a wafer are modified so that a plurality of chips on the wafer can be tested simultaneously.

Heretofore, a semiconductor testing device as shown in FIG. 1 was used to test semiconductor memory chips in the form of a wafer, hereinafter referred to as "wafer testing" or "wafer test" when applicable. As shown in FIG. 1, a probe card 3 for semiconductor devices, hereinafter referred to as "chips" when applicable, on a wafer 2 to be tested is fixed to a prober 1 and the wafer is positioned accurately on a prober stage 7. The probe card 3 is provided with probes 4 formed as an elongated conductor in correspondence to bonding pads formed on a chip to be tested so that, when the probes 4 are placed in contact with the bonding pads, a tester 5 and the chip 2 are connected in an electrical circuit. The tester 5 operates to deliver various signals to the chip 2 and to sense and evaluate the output data from the chip 2 thereby to carry out wafer testing. In the case when the chip 2 is found to be unsatisfactory as a result of such testing, a mark is printed on the chip 2 by an inker 6 on the prober 1 so that satisfactory chips can be distinguished from unsatisfactory chips. In testing all of the chips on a wafer, the wafer is usually moved in increments by the length or width of a chip. In other words, upon completion of the testing of each chip, the wafer is moved in a lengthwise or widthwise direction by as much as the size of the chip. When a row of chips arranged in a longitudinal or lateral direction have been tested, the following row of chips is tested. The chips, and accordingly the wafer, are moved with the sensor of the probe card operated over the wafer and a fully automatic movement system is provided which automatically operates the prober In FIG. 1, reference numeral 8 designates a microscope for observing the testing operations.

The probe cards 3 are each adapted for use with the particular type of chips to be tested. An example of a probe card 3 is shown in FIG. 2. In FIG. 2, reference numeral 3 designates the probe card. The probe card 3 is rectangular or circular or shaped as needed as that it can be readily coupled to the tester. The probe card 3 has a central window 3a so that the probes 4 of the probe card 3 can be correctly aligned with the chips 2 to be tested through the window 3a. The probes 4 are arranged on the probe card 3 with connections made to the tester. The number of probes 4 provided is determined from the number of bonding pads 2a on the chip 2, the distance between adjacent probes 4, and the size of the window 3a.

With the conventional wafer testing device constructed as described above, the chips on a wafer can be tested only one at a time. Accordingly, in testing large-capacity semiconductor memories or the like, the time required for testing each device is great and becomes more so as the memory capacity is increased. Thus, the conventional wafer test device is disadvantageous in that the test time required is relatively long.

SUMMARY OF THE INVENTION

Accordingly, an object of the present invention is to eliminate the above-described difficulties accompanying a conventional wafer test device. More specifically, an object of the invention is to provide a wafer testing device in which a plurality of wafers are tested simultaneously to reduce the time required for testing each chip.

These, as well as other objects of the invention, are met by a semiconductor testing device including a prober adapted to receive a wafer to be tested, a probe card coupled to the prober with the probe card having a window through which a plurality of semiconductor memory chips on the wafer are observable, a plurality of probes coupled to the periphery of the window in such a manner that the probes can be brought into contact with bonding pads on the semiconductor memory chips observable through the window, and a tester electrically and operatively connected to the probes.

Each of these semiconductor memory chips may be rectangular having bonding pads arranged along one side and two opposite sides of the chips. The window in that case is so provided or shaped that every adjacent two of the semiconductor memory chips arranged in one of the same orientation and in the opposite directions so that sides having opposite bonding pads are continuously adjacent one another can be observed through the window and probes are provided respectively for all of the bonding pads of every two of the semiconductor memory chips.

In another embodiment, each of the semiconductor memory chips is rectangular and has bonding pads which are arranged along two opposite sides and one other side thereof. In this case, the window is so shaped that every two adjacent of the semiconductor memory chips arranged regularly in the opposite directions so that opposite sides have the bonding pads are available as two opposite sides of a rectangle formed by every two of the semiconductor memory chips can be observed through the window and the probes are provided respectively for all the bonding pads of every two of the semiconductor memory chips.

In yet another embodiment, each of the semiconductor memory chips is rectangular and has bonding pads arranged along four sides thereof. The probe card then has two windows through which every two of the semiconductor memory chips which are arranged regularly with the same orientation can be observed and the two windows have probes coupled to the peripheries thereof in such a manner that the probes are provided respectively for all the bonding pads of every two of the semiconductor memory chips which are observed through the two windows.

In still a further embodiment, each of the semiconductor memory chips is rectangular and has bonding pads arranged along four sides thereof. The window in this case is so shaped that among the semiconductor memory chips arranged in one of regularly in the same orientation and in the opposite directions, all four semiconductor memory chips in a 2×2 arrangement can be observed through the window and the probes are provided respectively for all the bonding pads of two obliquely adjacent semiconductor chips of the four semiconductor memory chips.

DESCRIPTION OF THE PREFERRED EMBODIMENTS

Figure 1:
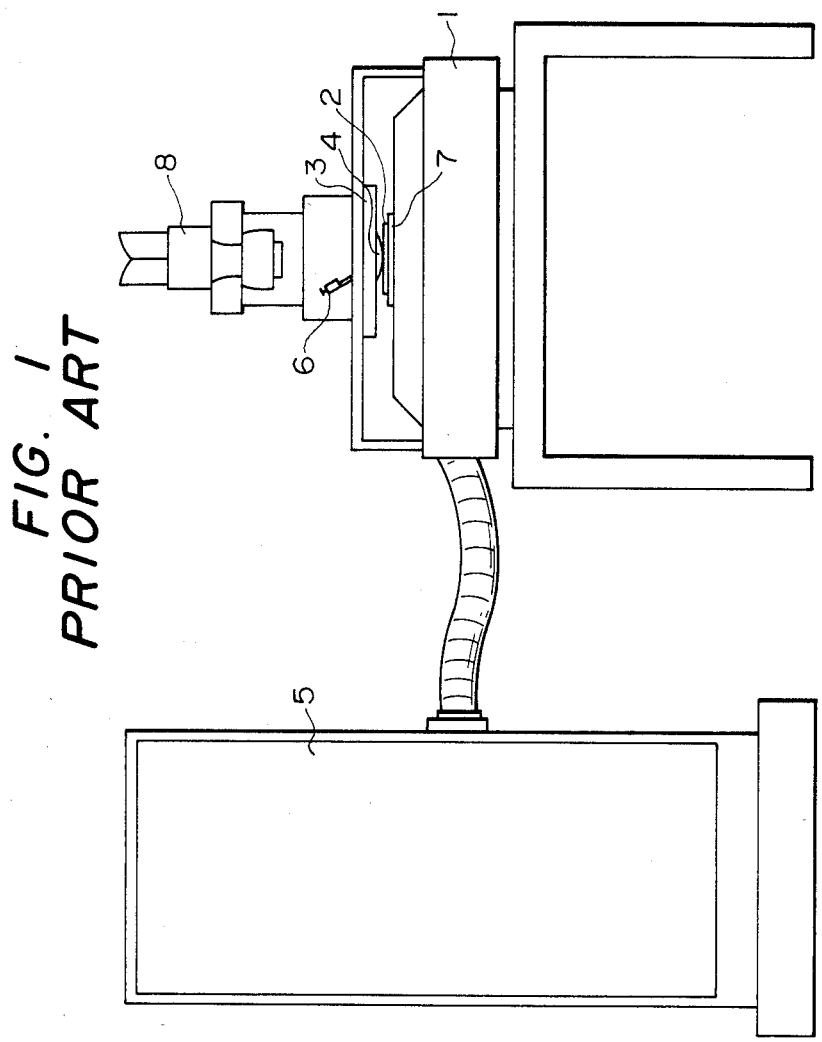
FIG. 1 is an explanatory diagram showing the arrangement of a conventional semiconductor testing device.
Figure 3:
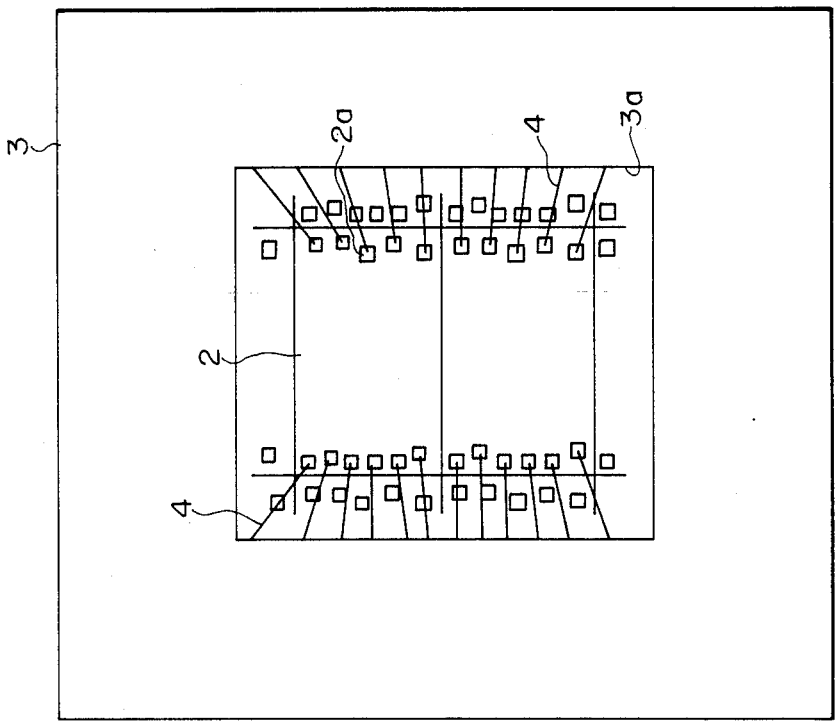
FIG. 3 is also an explanatory diagram showing the positional relationships between a window formed in the positional relationships between a window formed in a probe card employed in a semiconductor testing device according to one embodiment of the invention and two chips.
Figure 2:
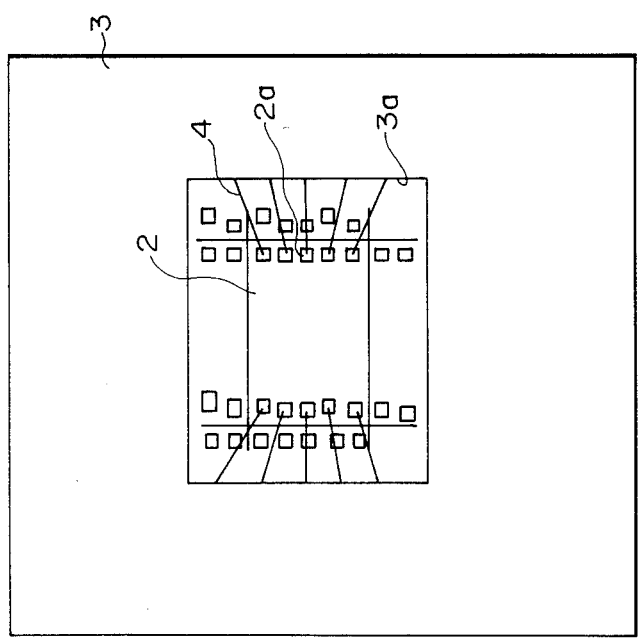
FIG. 2 is an explanatory diagram showing a probe card and the arrangement of chips on a wafer observed through the window of the probe card.

A preferred embodiment of a wafer test device of the invention will be described with reference to the accompanying drawings. FIG. 3 shows a probe card 3 in a semiconductor testing device constructed according to the invention. In order that a plurality of chips on a wafer can be tested simultaneously, the probe card 3 is designed as follows. The probe card 3 has a window 3a through which a plurality of (two in this case) chips 2 arranged vertically side-by-side can be observed. Probes 4 are arranged along the periphery of the window 3. One of the probes 4 is provided for each of the bonding pads 2a of the two chips. The probe card 3 is connected in an electrical circuit corresponding to the two chips and the same signal lines can be commonly used for the two chips. Thus, the drive circuit of the tester 5 can be effectively used.

Figure 4A:
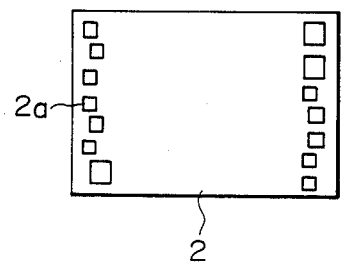
FIGS. 4A and 4B are diagrams showing examples of the arrangement of bonding pads.
Figure 4B:
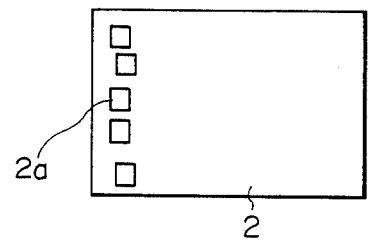
Figure 5A:
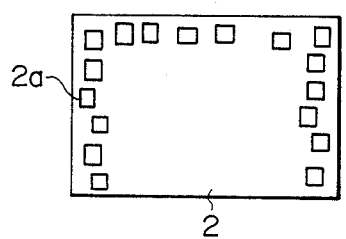
FIGS. 5A and 5B are diagrams showing examples of the arrangement of bonding pads in which the bonding pads are arranged along two opposite sides and one of the other sides of a chip and the bonding pads are arranged along two adjacent sides of a chip, respectively.
Figure 5B:
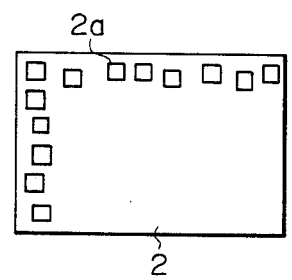
Figure 6A:
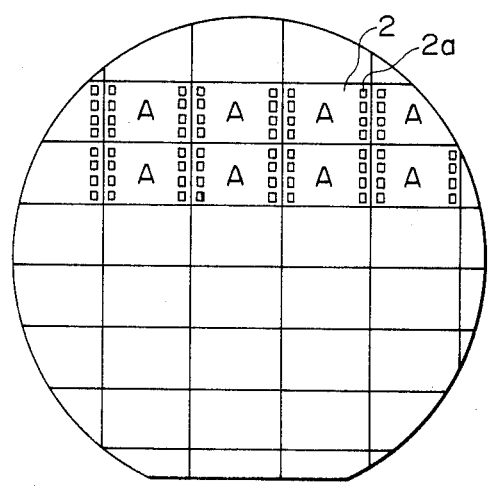
FIGS. 6A and 6B are diagrams showing chips which are arranged in the same orientation on the wafer and the positional relationships between the chips and probes provided in the window of a probe card, respectively.
Figure 6B:
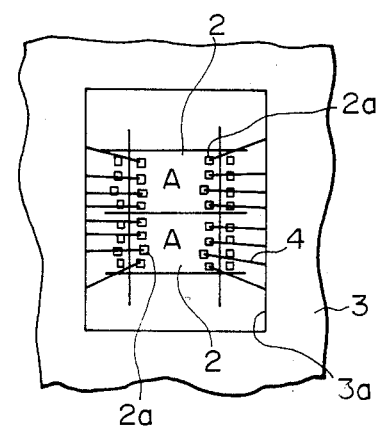
Figure 7A:
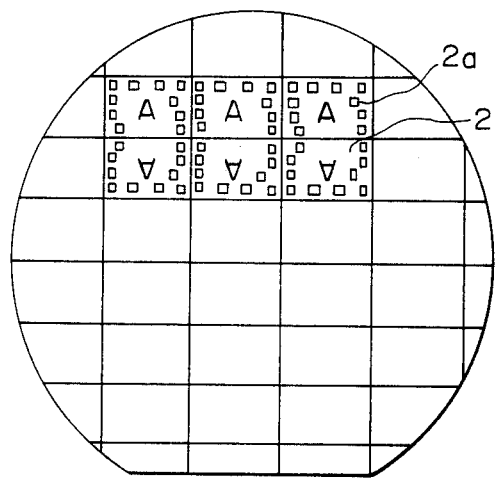
FIGS. 7A and 7B are diagrams showing chips which are arranged in the opposite direction on the wafer and the positional relationships between the chips and probe probes provied in the window of a probe card, respectively.
Figure 7B:
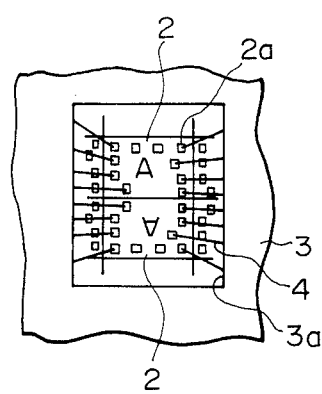

In the embodiment shown, the position of the bonding pads 2a of the chips are predetermined. In semiconductor memory devices, the bonding pads can be positioned or arranged at various locations on the chip. For the probe card 3 shown in FIG. 3, it is effective to position the bonding pads as shown in FIGS. 4A and 4B or 5A and 5B. Furthermore, a method for positioning or arranging chips on a wafer is also provided by the invention. In general, as shown in FIG. 6A, rectangular chips 2 are successively arranged with the same orientation. With this arrangement, with bonding pads 2a arranged on the chip 2 as shown in FIGS. 5A and 5B, two chips can be simultaneously tested by arranging the chips on the wafer as shown in FIGS. 7A and 7B. Bonding pads 2a can be arranged along two opposite sides or only one side of the chip 2 as shown in FIGS. 4A and 4B or they can be arranged along two opposite sides and one side of the chip or two adjacent sides of the chip as shown in FIGS. 5A and 5B or along all four sides. In the case where the bonding pads are arranged as shown in FIG. 4A or 4B, sides having the bonding pads are coupled to one another by arranging the chips 2 all with the same orientation as shown in FIG. 6A in which the character A indicates the direction of the chips. Two chips can then be tested at a time as is apparent from FIG. 6B. If the bonding pads are arranged as shown in FIG. 5, the chips 2 are to be arranged in the opposite directions as shown in FIG. 7A. In this arrangement, the sides having the bonding pads 2a are positioned along two opposite sides of a rectangle formed by the two chips so that two chips can be tested simultaneously as shown in FIG. 7B.

The chip test method used with the invention is the same as a conventional method. That is, the probe card 3 is attached to the probe 1 and a wafer to be tested is positioned on the prober stage 7. The wafer is then sequentially moved in a longitudinal or lateral direction at a pitch defined by the size of the chips. The chips can be readily tested continuously by making the pitch corresponding to the size of two chips. Depending on the test results, two independent inkers provided on the probe are operated to print marks on each of the two chips tested.

As is apparent from the above description, according to the preferred embodiment of the invention, the bonding pads are arranged on the chips as shown in FIGS. 4A and 4B or 5A and 5B and the window and the probes on the probe card are arranged in correspondence with the positions of the bonding pads as shown in FIG. 3. The chips are arranged on the wafer as shown in FIG. 6A and 6B or 7A and 7B. Accordingly, a plurality of semiconductor memory chips on a wafer can be tested simultaneously.

Figure 8:
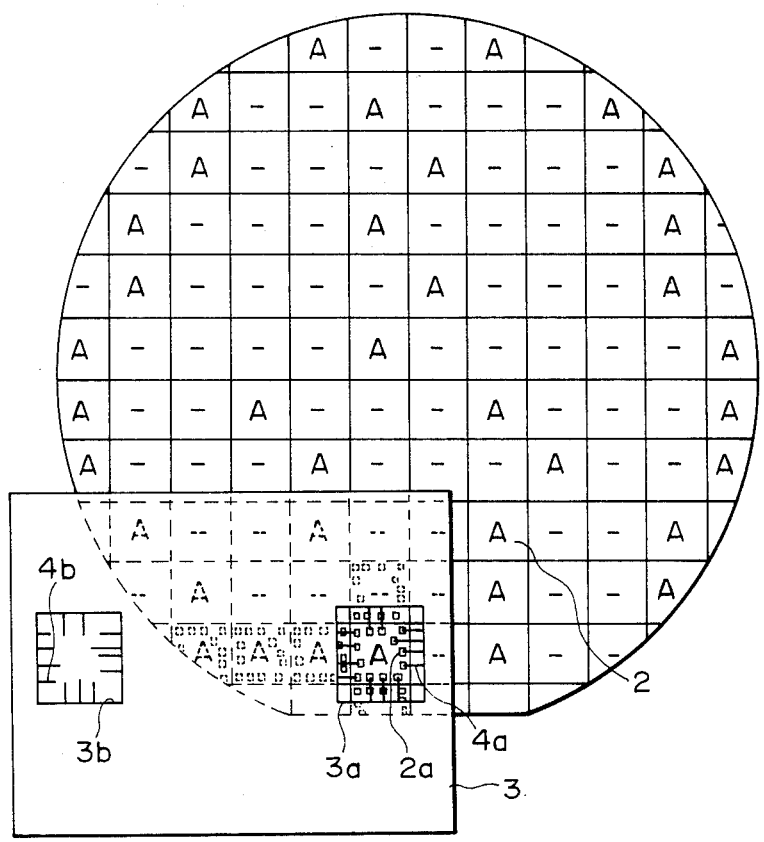
FIG. 8 is a diagram showing the positional relationships between a wafer having chips in each of which the bonding pads are arranged along the four sides of the chip and a probe card having two windows in which probes are arranged.

Another embodiment of the invention in which a plurality of rectangular chips each having bonding pads arranged along each of its four sides are tested simultaneously will be described with reference to FIG. 8. Chips 2 are arranged on the wafer all with the same orientation. The positional relationships between the bonding pads 2a of the chips 2 and a probe card 3 are as shown in FIG. 8. The probe card 3 has two windows 3a and 3b which are provided with probes 4a and 4b for the bonding pads 2a.

The test method used in this embodiment is as follows. The right-hand window 3a is provided with a sensor adapted to indicate the completion of a test. The test is started with the right-hand window 3a positioned over the central portion of the wafer. In other words, the right-hand window 3a is positioned over the central portion of the wafer which is the test start position and the right half and the left half of the wafer are tested with the probes corresponding to the right-hand window 3a and the left-hand window 3b, respectively. The completion of the test is detected by the sensor of the right-hand window 3a.

Figure 9:
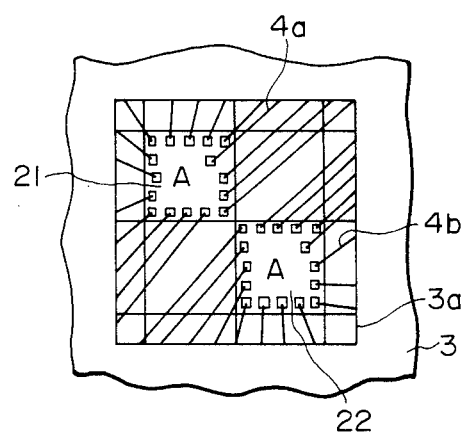
FIG. 9 is a diagram showing the positional relationships between a wafer having chips in each of which the bonding pads are arranged along the four sides of the chip and a probe card having one window in which probes are provided.

FIG. 9 shows a third embodiment of the invention. In this embodiment also, a plurality of rectangular chips each having bonding pads along the four sides thereof are tested simultaneously. A probe card 3 as shown in FIG. 9 has one window 3 which is provided with probes 4a and 4b for all the bonding pads 2a of two chips. With the probe card 3, two obliquely adjacent chips 21 and 22 instead of two parallel adjacent chips are tested simultaneously.

According to the invention, a plurality of semiconductor memory chips can be simultaneously tested with the bonding pads arranged on the chip as described above, with the window or windows and the probes of the probe card provided as described above, and with the chips arranged on the wafer as described above. Accordingly, with the use of the invention, the time required for testing such semiconductor memory chips is greatly reduced. This is a significant advantage of the invention for presently available semiconductor memories of high storage capacity.

Heretofore, as chips finally assembled in the form of a package had a stable configuration, two or four chips could be tested simultaneously. However, it was difficult to simultaneously test a plurality of chips on the wafers because of the configuration. On the other hand, according to the invention, bonding pads are arranged on the chip as described above, and in correspondence with this arrangement the probe card is constructed with the chips corresponding arranged on the wafer. That is, the positional relationships between the elements are taken into consideration to simultaneously test a plurality of chips.

What is claimed is:

1. A semi-conductor testing device comprising a prober adapted to receive a wafer to be tested, a probe card coupled to said prober, said probe card having a single rectangular window through which four identical semi-conductor chips on said wafer may be observed simultaneously, a first set of probes having free contact ends being mounted along two adjacent sides of said window with said free contact ends being disposed in a contact pattern adjacent one corner of said rectangular window and a second set of probes having free contact ends being mounted along the remaining two sides of said rectangular window with said free contact ends being disposed in an identical contact pattern adjacent a corner of said rectangular window diagonally opposite the first mentioned corner wherein said probes in each set are adapted to be connected to a common set of lead wires whereby two semi-conductor chips can be tested simultaneously.

2. A semi-conductor testing device as set forth in claim 1 wherein the free contact ends of each set of probes are disposed in a substantially rectangular pattern.

* * * * *